United States Patent [19]
Tang et al.

[11] Patent Number: 5,190,887
[45] Date of Patent: Mar. 2, 1993

[54] METHOD OF MAKING ELECTRICALLY ERASABLE AND ELECTRICALLY PROGRAMMABLE MEMORY CELL WITH EXTENDED CYCLING ENDURANCE

[75] Inventors: Daniel N. Tang; Gregory E. Atwood, both of San Jose, Calif.

[73] Assignee: Intel Corporation, Santa Clara, Calif.

[21] Appl. No.: 815,946

[22] Filed: Dec. 30, 1991

[51] Int. Cl.$^5$ .............................................. H01L 21/70
[52] U.S. Cl. ......................................... 437/43; 437/34; 437/48; 437/52; 437/228; 437/229
[58] Field of Search ........................ 437/34, 43, 48, 52, 437/228, 229; 357/23.5

[56] References Cited

U.S. PATENT DOCUMENTS

| | | | |
|---|---|---|---|
| 4,232,439 | 11/1980 | Shibata | 437/35 |
| 4,642,881 | 2/1987 | Matsakawa et al. | 437/43 |
| 4,698,787 | 10/1987 | Mukherjee | 357/23.5 |
| 4,780,424 | 10/1988 | Holler | 437/29 |

OTHER PUBLICATIONS

Tam, et al., "A High Density CMOS 1-T Electrically Erasable Non-Volatile (Flash) Memory Technology," *Symposium on VLSI Technology*, pp. 31–32 (1988).
Gill, et al., "A 5-Volt Contactless Array 256KBit Flash EEPROM Technology," *IEDM*, pp. 428–431 (1988).
Masuoka, et al., "A New Flash E$^2$PROM Cell Using Triple Polysilicon Technology," *IEDM*, pp. 464–467 (1984).
U.S. patent application Ser. No. 07/700,512, filed May 15, 1991.
Kume, et al., "A Flash-Erase EEPROM Cell with an Asymmetric Source and Drain Structure," *IEDM*, pp. 560–563 (1987).
Ohshima, et al., "Process and Device Technologies for 16Mbit EPROMs with Large-Tilt-Angle Implanted P-Pocket Cell," *IEDM*, pp. 95–98 (1990).

*Primary Examiner*—Tom Thomas
*Attorney, Agent, or Firm*—Blakely, Sokoloff, Taylor & Zafman

[57] ABSTRACT

A method of forming a doped region within a monocrystalline silicon layer of an integrated circuit having an electrically erasable and electrically programmable memory device on a semiconductor substrate, wherein the doped region lies within a channel region near a drain region, but does not lie within a source region. After a patterned layer is formed over the channel region, the substrate is doped by ion implantation with a first dopant at a tilt angle no less than a minimum tilt angle and at about a predetermined azimuthal angle, such that a significant number of ions enter a drain region and a channel region near the drain region and substantially no ions enter a source region. The first dopant is the same dopant type as the monocrystalline silicon layer dopant. The drain region is masked. The source region is doped with a second dopant. The second dopant is an opposite dopant type as the monocrystalline silicon layer dopant. The source region and the drain region are doped with a third dopant. The third dopant is the same dopant type as the second dopant. The third dopant dose is heavier than the first dopant dose, and the second dopant diffusion coefficient is greater than the third dopant diffusion coefficient.

15 Claims, 5 Drawing Sheets

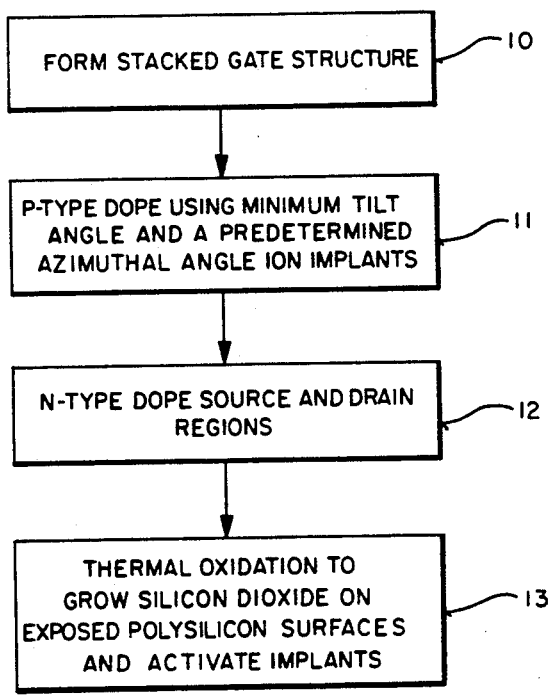
FIG_1
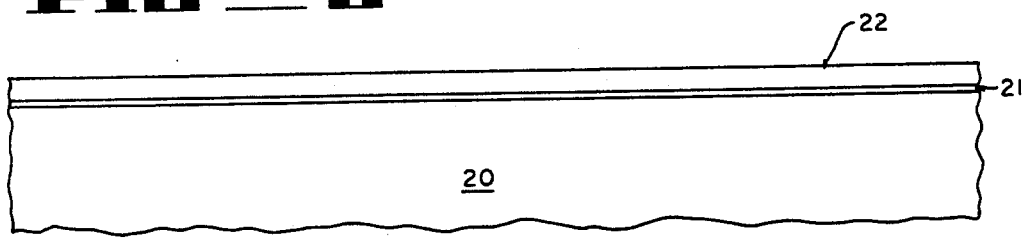
FIG_2
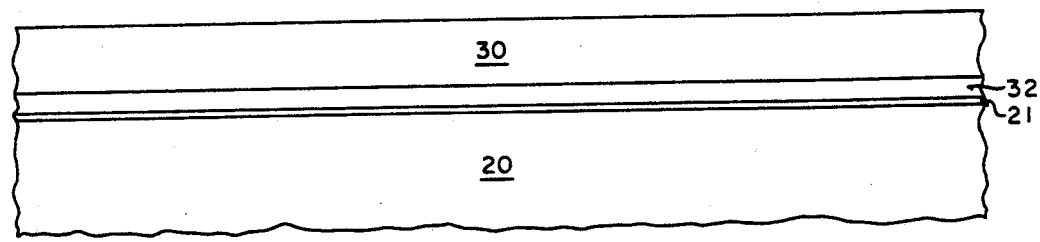
FIG_3

FIG_4
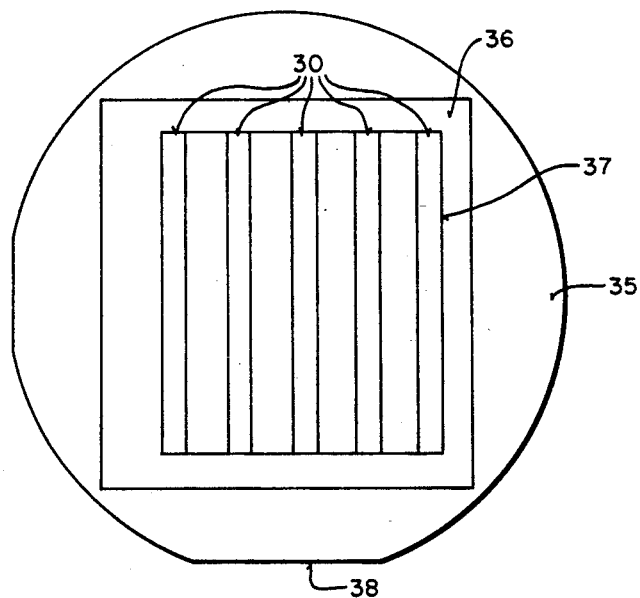
FIG_5
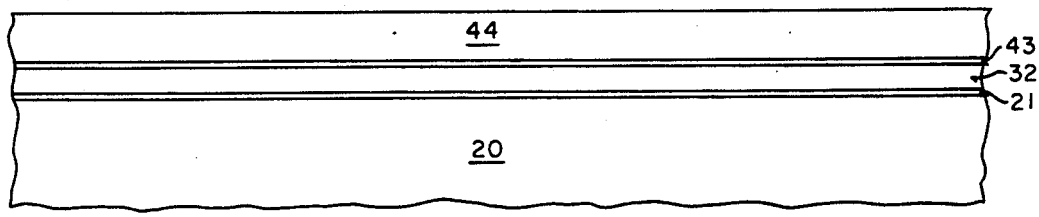
FIG_6
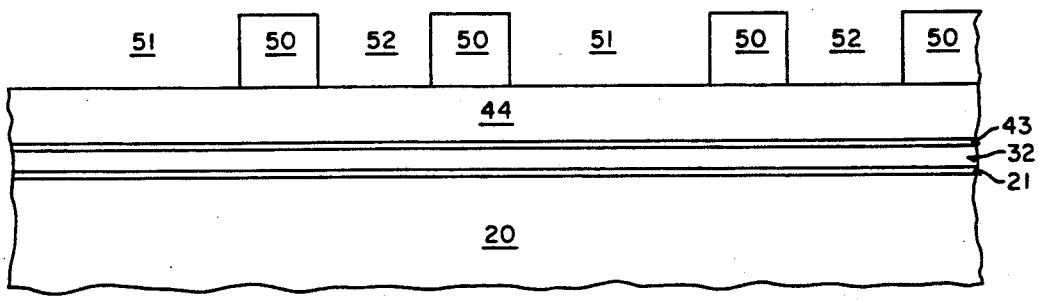

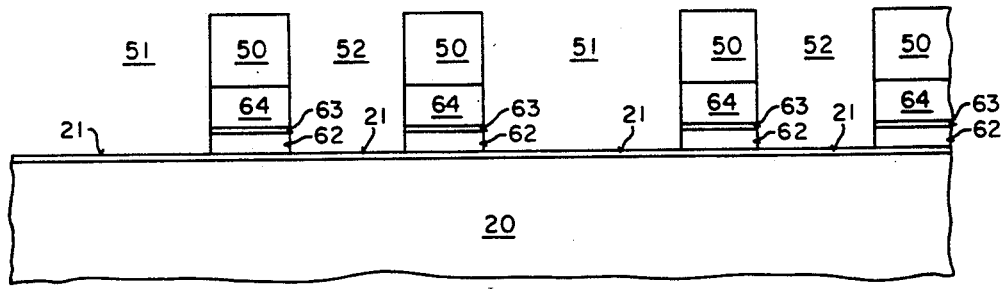
FIG_7
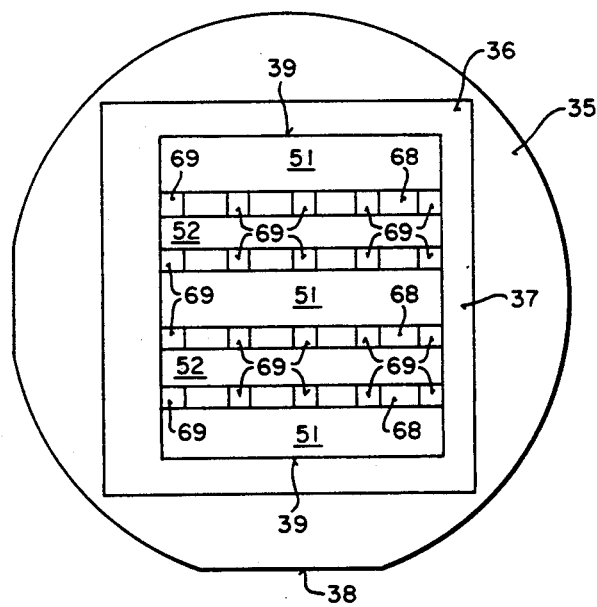
FIG_8
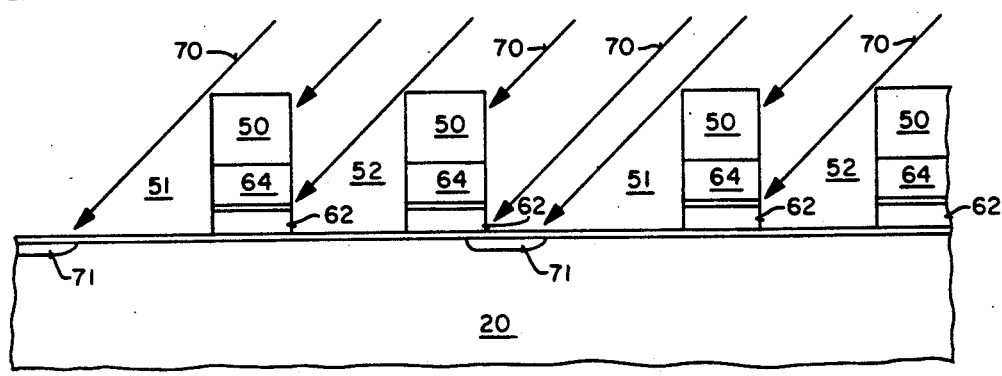
FIG_9

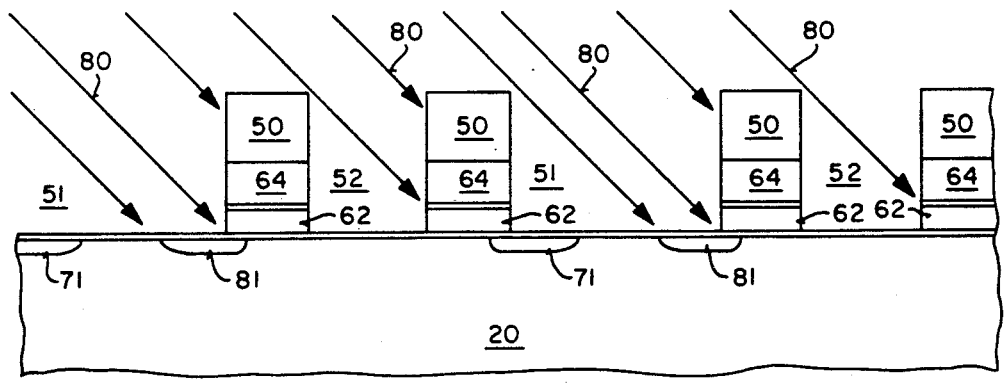
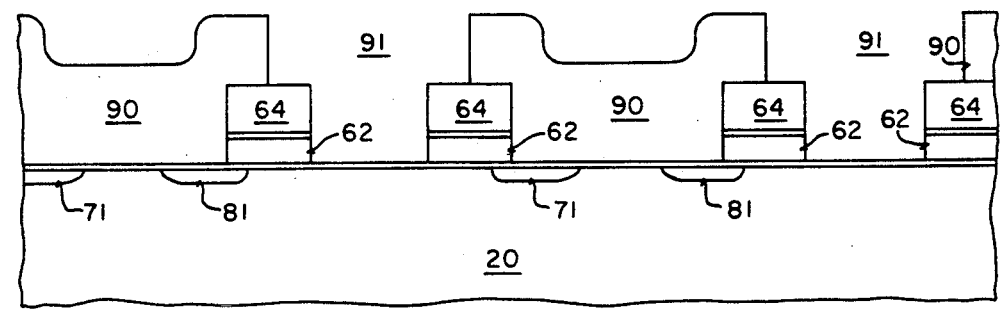
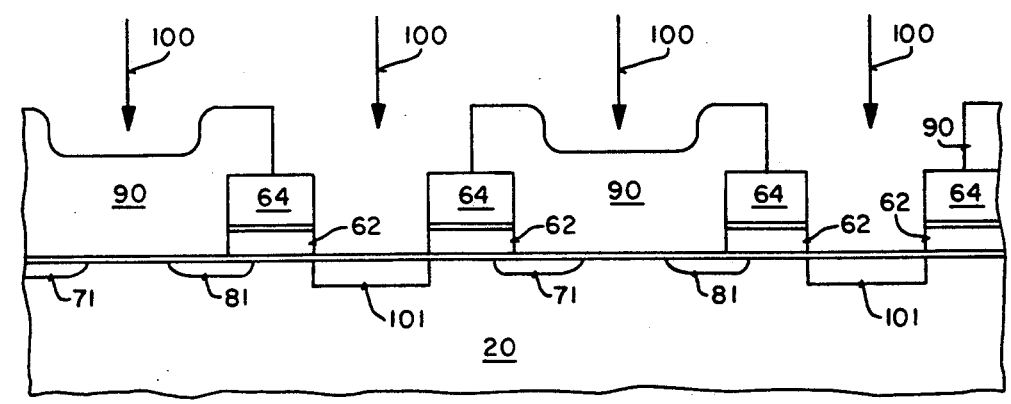

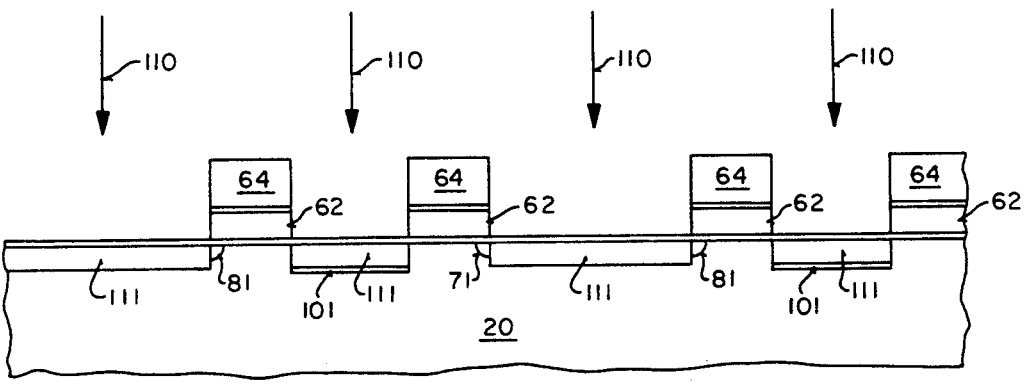
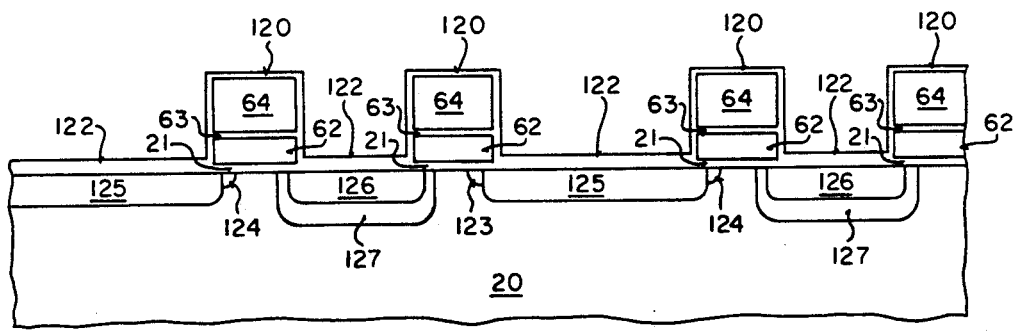

METHOD OF MAKING ELECTRICALLY ERASABLE AND ELECTRICALLY PROGRAMMABLE MEMORY CELL WITH EXTENDED CYCLING ENDURANCE

FIELD OF THE INVENTION

The present invention relates generally to the field of processing semiconductor devices, and in particular, to the formation of an electrically erasable and electrically programmable memory device having extended cycling endurance.

BACKGROUND OF THE INVENTION

A flash EEPROM is a memory device that typically includes a memory array having field-effect memory cells. Each memory cell typically includes a source region, a drain region, a channel region, a tunnel dielectric layer, a floating gate layer, a control gate layer, and an intergate insulating layer (between the control gate layer and the floating gate layer). In the flash EEPROM, the floating gate layer typically has a charge state, which is a programmed state or an erased state. When the floating gate layer is in a programmed state, the floating gate layer has a relatively high number of electrons. The electrons typically lower the floating gate potential below the threshold voltage of the cell. When a programmed cell is at read biasing conditions, the cell typically has a relatively low current flow through its channel. When the floating gate layer is in an erased state, the floating gate layer has a relatively low number of electrons. Fewer electrons cause a higher floating gate potential that is typically above the threshold voltage of the cell. When an erased cell is at read biasing conditions, the cell has a relatively high current flow through its channel.

For one prior art flash EEPROM, the charge state of the floating gate layer may be changed by programming the cell using hot electron injection through the drain side or by erasing the cell using Fowler-Nordheim tunneling through the source side. A prior art flash EEPROM has been found to have a limited number of cycles. After about 10,000 cycles, the cell's programming and erasing efficient is typically lowered. The lower efficiency is believed to be due to electrons and holes trapped in the tunnel dielectric layer. The trapped charge can reduce the effective field across the layer and slow down the programming or erasing process. After about 100,000 cycles, the cell typically can no longer be programmed or erased properly.

Programming performance of the cell is typically improved by increasing the channel dopant concentration near its drain region. The higher channel doping concentration causes a relatively high channel current and electric field near the drain region and allows sufficient generation of hot electrons near the drain region. However, the increased dopant concentration typically lowers the source-substrate breakdown voltage because the breakdown voltage generally decreases as the channel doping concentration increases. The source potential during erase is typically limited by the source-substrate diffusion junction breakdown voltage. If the device is erased when the source potential is higher than the source-substrate diffusion junction breakdown voltage, reliability problems including damage to the tunnel oxide-substrate interface and hole accumulation within the tunnel oxide layer may occur. As the device is cycled more times, the device is more likely to become non-functional because of the reliability problems. If the channel doping concentration is lowered to give a higher source-substrate diffusion junction breakdown voltage, the programming performance is typically not optimized. Therefore, one typically chooses to optimize the programming performance of the cell or the erasing performance of the cell.

SUMMARY AND OBJECTS OF THE INVENTION

In view of the foregoing, one object of the present invention is to produce a memory device having a higher source-substrate diffusion junction breakdown voltage.

It is yet another object of the present invention to form a device with extended cycling endurance.

It is an additional object of the present invention to increase the source-substrate junction breakdown without significantly altering the programming of the device.

A method of forming an electrically erasable and electrically programmable memory device including a field-effect memory cell on a semiconductor substrate is described. The substrate includes a monocrystalline silicon layer having a first region, a second region, and a third region, the first region and the third region lying on opposite sides and immediately adjacent to the second region. A tunnel dielectric layer is formed over the second region within the doped monocrystalline silicon layer. A floating gate layer is deposited over the tunnel dielectric layer. A first patterned photoresist layer is formed over the floating gate layer, and the floating gate layer is patterned. An intergate insulating layer is formed over the floating gate layer. A control gate layer is formed over the intergate insulating layer. A second patterned photoresist layer is formed over the control gate layer, and the control gate layer is patterned. The substrate is doped with a first dopant. The first dopant is the same dopant type as the monocrystalline silicon layer dopant. The doping is done by ion implantation at a tilt angle no less than a minimum tilt angle and at about a predetermined azimuthal angle, such that a significant number of ions enter the first region and the second region near the first region and substantially no ions enter the third region, whereas if either the tilt angle is less than the minimum tilt angle or the azimuthal angle is not at about the predetermined azimuthal angle, a significant number of ions would enter the third region. The first region is masked. The third region is doped with a second dopant. The second dopant is an opposite dopant type as the monocrystalline silicon layer dopant. The first region and the third region are doped with a third dopant. The third dopant is the same dopant type as the second dopant. The third dopant dose is heavier than the first dopant dose, and the second dopant diffusion coefficient is greater than the third dopant diffusion coefficient.

Other objects, features, and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which:

FIG. 1 includes an illustration of a process flow diagram of one preferred embodiment.

FIG. 2 includes an illustration of a cross sectional view of a portion of a substrate before patterning a floating gate layer.

FIG. 3 includes an illustration of the substrate of FIG. 2 after patterning the floating gate layer in accordance with one preferred embodiment.

FIG. 4 includes an illustration of a top view of the substrate of FIG. 3 illustrating the orientation of floating gate strips in accordance with one preferred embodiment.

FIG. 5 includes an illustration of the substrate of FIG. 3 after a control gate layer is formed in accordance with one preferred embodiment.

FIG. 6 includes an illustration of the substrate of FIG. 5 after forming photoresist members over the control gate layer in accordance with one preferred embodiment.

FIG. 7 includes an illustration of the substrate of FIG. 6 after patterning the control gate layer.

FIG. 8 includes an illustration of a top view of the substrate of FIG. 7 illustrating the orientation of the word lines in accordance with one preferred embodiment.

FIG. 9 includes an illustration of the substrate of FIG. 7 during ion implantation of a first p-type dopant doping step in accordance with one preferred embodiment.

FIG. 10 includes an illustration of the substrate of FIG. 9 during ion implantation of a second p-type dopant doping step in accordance with one preferred embodiment.

FIG. 11 includes an illustration of the substrate of FIG. 10 after a patterned masking layer has been formed over the drain regions in accordance with one preferred embodiment.

FIG. 12 includes an illustration of the substrate of FIG. 11 during ion implantation of phosphorus ions into source regions in accordance with one preferred embodiment.

FIG. 13 includes an illustration of the substrate of FIG. 12 during ion implantation of arsenic ions into the source and drain regions in accordance with one preferred embodiment.

FIG. 14 includes an illustration of the substrate of FIG. 13 after a thermal cycle in accordance with one preferred embodiment.

DETAILED DESCRIPTION

A preferred embodiment of the present invention implants ions at a tilt angle no less than a minimum tilt angle and at about a predetermined azimuthal (rotational) angle, so that ions enter a drain region and a region partially under a stacked gate structure near the drain region, but no significant number of ions enter a source region. The minimum tilt angle and the predetermined azimuthal angle substantially prevent ions from entering a source region during the ion implanting step. A preferred embodiment of the present invention does not need an additional masking layer to protect the source region during the doping step and provides a doping process that is self-aligned to the drain region.

FIG. 1 is a process flow chart of one preferred embodiment used to form a flash EEPROM device including a memory array having a plurality of field-effect memory cells. A stacked gate structure is formed over a semiconductor substrate (step 10), p-type regions are formed within drain regions and partly under the stacked gate structure using ion implantation at a tilt angle no less than a minimum tilt angle and at a predetermined azimuthal angle (step 11), source and drain regions are doped using n-type dopants (step 12), and the substrate is thermally oxidized (step 13). Using one preferred embodiment, the p-type regions of step 12 are formed while photoresist members from the stacked gate etch are present over control gate members. The tilt angle and the azimuthal angle are adjusted so that ions enter the drain regions and the region under the stacked gate near the drain region, but a significant number of ions do not enter the source region. In an alternate embodiment, an electrically erasable and electrically programmable memory device may be formed.

FIG. 2 is a cross-sectional view of a semiconductor substrate. In one preferred embodiment, the substrate has a boron-doped monocrystalline silicon layer (silicon layer) 20. A tunnel dielectric layer 21 about 110 Å thick is formed over the silicon layer 20 by thermally growing a silicon dioxide layer from the silicon layer 20. A floating gate layer 22 comprised of polycrystalline silicon (polysilicon) about 1500 Å thick is deposited over the tunnel dielectric layer 21. The floating gate layer 22 is doped to increase its conductivity. A first patterned photoresist layer is formed over the floating gate layer 22 by coating the substrate with about 1.0 μm of photoresist and patterning the photoresist layer using well known photolithographic methods. The first patterned photoresist layer includes a photoresist member 30 as illustrated in FIG. 3. FIG. 4 is a top view of substrate in FIG. 3 and includes a substrate 35 with the flash EEPROM 36 including a memory array 37 having photoresist members 30 that are substantially normal to the primary flat 38. For simplicity, peripheral circuits within the flash EEPROM are not shown. The floating gate layer 22 is patterned by selectively etching the floating gate layer 22 using well known methods to form floating gate strips 32. The floating gate strips 32 generally run parallel to the surface of FIG. 3. The photoresist members 30 are removed by plasma ashing or a hot mixture of sulfuric acid and hydrogen peroxide. Within the memory array, there are typically several floating gate strips that are substantially parallel with one another.

An intergate insulating layer 43 is formed over the floating gate strips 32. The intergate insulating layer is comprised of thin layers of silicon dioxide, silicon nitride, and silicon dioxide. The total thickness of the intergate insulating layer 43 is about 200 Å. A control gate layer 44 comprised of polysilicon about 2000 Å thick and tungsten silicide about 2500 Å is formed over the intergate insulating layer 43. The polysilicon control gate layer 22 is doped to increase its conductivity. The tungsten silicide is formed by reacting tungsten with part of the underlying polysilicon layer using well known methods. For simplicity, the control gate layer 44 is shown as a single layer. A second patterned photoresist layer is formed over the control gate layer 44 by coating the substrate with about 1.0 μm of photoresist and patterning the photoresist layer using well known photolithographic methods. The second patterned photoresist layer includes photoresist members 50 as illustrated in FIG. 6. The photoresist members 50 are strips that are generally parallel to the primary flat and perpendicular to the floating gate strips 30. The photoresist pattern has openings 51 and 52. The openings 51 are locations where drain regions are subsequently formed and are each about 2.5 μm wide. The openings 52 are locations where source regions are subsequently formed and are each about 1.5 μm wide.

The control gate layer 44, the intergate insulating layer 43, and the floating gate strips 32 are patterned by selectively etching the control gate layer 44, the intergate insulating layer 43, and the floating gate strips 32 using well known methods. The patterning forms stacked gate structures comprised of control gate members 64, intergate insulating members 63, floating gate members 62 and the tunnel dielectric layer 21 as shown in FIG. 7. The floating gate members 62, and insulating gate members 63 are generally rectangular in shape. The control gate members 64 are typically long strips that are used for the control gate electrodes and are called word lines. The control gate members 64 are substantially parallel to each other. FIG. 8 illustrates a top view of the substrate 35 with the flash EEPROM 36 including the memory array 37. Within FIG. 8, the word lines 68 and the photoresist members 50 over the word lines 68 are substantially parallel to the primary flat 38. For each memory cell, the floating gate member 62 and intergate insulating member 63 are substantially coincident with each other from the top view and are generally illustrated as the boxes 69 within the memory array. As can be seen, the memory array 37 is generally rectangular and has a pair of opposite sides 39. Immediately adjacent to the opposite sides 39 are openings 51. For simplicity, peripheral circuits within the device are not shown.

In one preferred embodiment, the substrate is subjected to two boron doping steps. FIG. 9 is an illustration of a first doping step. The substrate is placed in an ion implanter having a first tilt angle ($\theta_1$) of about 50° and an azimuthal (rotational) angle of about 0°. A tilt angle is measured from a direction normal to the substrate surface. An azimuthal angle of 0° corresponds to the primary flat being at the 6 o'clock position with respect to the ion beam within the ion implanter. An ion implanter capable of doing such an implant is the Extrion 220 made by Varian Associates. During the first of the two ion implants, the ion implanter implants B+11 ions. A B+11 ion is a boron atom that is ionized to have a single positive charge, and each boron atom has a mass of about 11 atomic mass units. The ions have an energy of about 40 KeV and are implanted into a substrate to a dose of approximately 1E12 ions/cm².

As shown in FIG. 9, the openings 51 are about 2.5 μm wide, the openings 52 are about 1.5 μm wide, and the stacked gate structures with the photoresist members 50 are about 1.6 μm high. A significant number of ions do not enter the silicon layer 20 under openings 52 because the first tilt angle ($\theta_1$) is about 50° and the height of the stacked gate structures with the photoresist members 50 are greater than the widths of openings 52. A significant number of ions enter the silicon layer 20 under openings 51 because the first tilt angle ($\theta_1$) is about 50° and the height of the stacked gate structures with the photoresist members 50 are less than the width of openings 51. The implanted regions are generally illustrated as first p-type regions 71. Part of a first p-type region 71, as implanted, lies beneath a stacked gate structure.

After the substrate has been implanted with the first ion implant, the substrate is rotated to an azimuthal angle of about 180° and is substrate is rotated to an azimuthal angle of about 180° and is implanted as shown in FIG. 10. The implant parameters other than the azimuthal angle are about the same as previously described. The first angle ($\theta_1$) and the second tilt angle ($\theta_2$) are about 50°. The 180° azimuthal angle corresponds to the substrate being positioned in the ion implanter, so that the primary flat at the 12 o'clock position with respect to the ion beam. A significant number of ions do not enter the silicon layer 20 under openings 52, and a significant number of ions enter the silicon layer 20 under openings 51. The implanted regions are generally illustrated as second p-type regions 81. Part of the second p-type regions 81 as implanted lies beneath stacked gate structures. The photoresist members 50 are removed using plasma ashing or a hot mixture of sulfuric acid and hydrogen peroxide.

A photoresist layer is coated over the substrate 20 and patterned using well known methods to form photoresist members 90 and openings 91 between the photoresist members 90 as shown in FIG. 11. The photoresist members 90 mask regions where drain regions are subsequently formed. The openings 91 lie over regions where the source regions are subsequently formed. The substrate is doped by ion implantation using P+31 ions at an energy of about 35 KeV to a dose of about 5E14 ions/cm² as shown in FIG. 12. The ion implant is illustrated as arrows 100. Within openings 91, ions pass through the tunnel dielectric layer within openings between the stacked gate structures and stop within the monocrystalline silicon layer 20 within hundreds of angstroms of the tunnel dielectric layer and are generally shown as regions 101. In the locations where stacked gate structures are partially exposed within openings 91, substantially none of the ions penetrates through the four layers of the stacked gate structure (control gate member 64, intergate insulating layer 63, floating gate member 62, and tunnel dielectric layer 21). Substantially none of the ions penetrates through the photoresist members 90, thereby preventing the ions from reaching the regions where the drain regions are subsequently formed. The photoresist members 90 are removed using plasma ashing or a hot mixture of sulfuric acid and hydrogen peroxide.

The substrate is doped by ion implantation as illustrated in FIG. 13. As+75 ions are implanted at about 35 KeV to a dose of about 5E15 ions/cm². The implant is generally illustrated by arrows 110 and form doped regions 111. The substrate is thermally oxidized using well known methods to activate the ions implanted from the four ion implant steps and to grow a silicon dioxide layer 120 to protect the control gate member 64 and the floating gate member 62 during subsequent processing steps. The implanted areas are activated and form drain regions 125, a first p-type region 123 adjacent to a drain region 125, second p-type regions 124 adjacent to drain region 125, and source regions comprised of a phosphorus doped region 127 and an arsenic doped region 126. The arsenic doped region 126 is similar to the drain region 125. Channel regions are regions within the silicon layer and lie between the source regions and the drain regions under the stacked gate structures. The channel regions include a first p-type region or a second p-type region. A silicon dioxide layer 122 over the source regions and drain regions is thicker than the tunnel dielectric layer 21.

The substrate is further processed to form a finished device including an insulating glass layer, at least one interconnect layer, at least one interlevel dielectric layer between interconnect layers when two or more interconnect layers are used, and at least one passivation layer. The steps after the arsenic implant step are well known.

Many variations may be used without deviating from the scope or spirit of the present invention. A p-type region may be implanted anytime after the first patterned photoresist layer is formed over the floating gate layer and anytime before the last thermal cycle prior to the deposition of an insulating glass layer used to insulate the devices from an interconnecting layer. The order of the four ion implants previously described may be changed. The implanting order can be done using any sequence of the implanting steps, as long as, the source region is graded, the p-type regions extend laterally beyond the drain regions under the stacked gate structure, and no significant p-type dopant is implanted into the source regions. A thermal cycle may be used between any of the implanting steps. For example, a thermal cycle may be used to drive the boron dopant from the two implanting steps before the n-type doping steps. The thermal cycles can be used as long as the tilt angle dopant regions extend into the channel regions near the drain regions.

The tilt angle depends upon the thicknesses of the layers above a channel region at the time of the boron implant. The layers form a height that is about equivalent to the sum of the layers' thicknesses at the time of the boron implant. The source regions can have varying widths, and the drain regions can have varying widths. The tilt angle also depends on the width of the openings at the time of the implant. Each source region width must be narrower than each drain region width in order to substantially prevent any ions from entering the silicon layer within the source regions, but to allow ions to enter the silicon layer within the drain region and the silicon layer within the channel region near the drain region. In general, the minimum tilt angle is about equivalent to the arc tangent of the height divided by the width of an opening where the widest source region is formed. In general, the maximum tilt angle is about equivalent to the arc tangent of the height divided by the width of an opening where the narrowest drain region is formed. Therefore, the height and widths of the openings at the time of ion implantation must be known so that the proper tilt angle is selected.

In still other alternate embodiments, openings 52 lie at the opposite sides 39 of the memory array 37. An opening 51 may lie at one opposite side 39, and an opening 52 may lie at the other opposite side. A word line 68 does not lie at either opposite side 39. The minimum tilt angle for the boron dopant steps may be more when an opening 52 is at one of the opposite sides 39 of the memory array 37. One can determine the minimum tilt angle if the topography of the substrate is known.

In alternative embodiments, the layout of the word lines may be changed. The memory array may be oriented such that the word lines are substantially parallel to each other and substantially normal to the primary flat. The first boron implant uses an azimuthal angle is about 90°, and the second boron implant uses an azimuthal angle is about 270°. The relative difference between the azimuthal angles is about 180°. Other memory array layouts of the word lines are possible, as long as, the word lines are substantially parallel with each other and the relative difference between the azimuthal angles is about 180°.

In still other embodiments, the p-type regions may be implanted using different implant parameters. The selection of implant parameters typically depends on the point in the process flow where the implant is done or the desired device characteristics. The energy of the implant must be sufficient so that the ions enter the silicon layer in the desired locations. The arsenic doping dose should be greater than about the sum of the boron dopant doses to reduce the risk of counterdoping. Each boron dopant dose is typically between $1E10$ ions/cm$^2$ to $1E13$ ions/cm$^2$. The p-type regions may be asymmetric with respect to the drain regions. A drain region may lie completely within a p-type region. The p-type regions may be doped with different p-type dopants, such as aluminum or gallium.

The source region does not need to be implanted with arsenic and phosphorus. The source region only needs to be implanted with n-type dopants that have different diffusion coefficients. A n-type dopant such as antimony may be used. Therefore, the source and drain doping may use antimony and the graded source doping may use phosphorus. The graded source region gives a higher source-substrate diffusion junction breakdown voltage compared to an ungraded source region. The higher breakdown voltage allows a higher source potential during erase, so that the electrons can be more quickly removed from the floating gate layer without as many reliability problems. Therefore, the device may be cycled a larger number of times without adversely affecting the performance of the device.

Alternatively, an electrically erasable and electrically programmable memory device may be formed. In an alternate embodiment, a p-channel device may be formed. In that case, dopant types of the silicon layer and the regions within the silicon layer are reversed. The monocrystalline silicon layer is n-type doped, the source region has a graded p-type doping profile, the drain region is p-typed doped, and n-type regions near the p-type drain regions are ion implanted using a tilt angle and an azimuthal angle that substantially prevent n-type ions from entering the source regions. In general, the monocrystalline silicon layer dopant and the tilt angle implant dopants are the same (both n-type dopants or both p-type dopants). The source and drain regions are doped with a dopant having a dopant type opposite that of the monocrystalline silicon layer.

One advantage of one preferred embodiment of the present invention is that it helps raise the source-substrate diffusion junction breakdown because a p-type region is not formed immediately adjacent to a source region and the source regions have a graded dopant profile. A higher source-substrate diffusion junction breakdown voltage allows a higher source potential when erasing a memory device. The higher potential helps to erase the memory device faster. The programming of the device is not adversely affected because a p-type region is immediately adjacent to a drain region. Better erasing performance is not at the expense of programming performance. The device can withstand more cycles compared to the prior art because the higher source-substrate diffusion junction voltage helps to reduce reliability problems. Misalignment of the channel doping region near the drain region is typically not a problem because the channel dopant may be self-aligned to the drain region near a stacked gate structure. The embodiments described herein do not require an additional masking step.

A variety of materials and doping levels may be used in alternate embodiments. The tunnel dielectric layer and intergate insulating layer may be comprised of silicon dioxide, silicon nitride, or silicon oxynitride. The layers may be thermally grown or chemically deposited. The floating gate layer may be comprised of a silicon material including amorphous silicon or polysilicon. The control gate layer may be comprised of a silicon material (e.g., amorphous silicon or polysilicon), silicide compounds, or conductive materials, such as metals and metallic compounds. The thermal oxidation following the implants may be replaced by a chemically deposited dielectric layer followed by a thermal anneal or densification step. The source regions, drain regions, floating gate layer, and control gate layer may be doped using a furnace doping step. The floating gate layer and control gate layer may be doped during a silicon material deposition. At the doping steps, the dopants used and the doping parameters may be changed as long as the dopants and doping parameters are within the limits previously described.

In the foregoing specification, the invention has been described with reference to specific embodiments thereof. It will, however, be evident that various modifications and changes made thereto without departing from the broader spirit and scope of the invention as set forth in the appended claims. The specification and drawings are, accordingly, to be regarded in an illustrative rather than a restrictive sense.

What is claimed is:

1. A method of forming an electrically erasable nonvolatile memory device including a field-effect memory cell on a semiconductor substrate comprising the steps of:

forming a tunnel dielectric layer over a second region within a doped monocrystalline silicon layer of the substrate, wherein the monocrystalline silicon layer includes a first region, the second region, and a third region, the first region and the third region lying on opposite sides and immediately adjacent to the second region;

depositing a floating gate layer over the tunnel dielectric layer;

forming a first patterned photoresist layer over the floating gate layer;

patterning the floating gate layer;

forming an intergate insulating layer over the floating gate layer;

forming a control gate layer over the intergate insulating layer;

forming a second patterned photoresist layer over the control gate layer;

patterning the control gate layer;

after forming the first patterned photoresist layer, doping the substrate with a first dopant, the first dopant being the same dopant type as the monocrystalline silicon layer dopant, the doping being done by ion implantation at a tilt angle no less than a minimum tilt angle and at about a predetermined azimuthal angle, such that a significant number of ions enter the first region and the second region near the first region and substantially no ions enter the third region, whereas if either the tilt angle is less than the minimum tilt angle or the azimuthal angle is not at about the predetermined azimuthal angle, a significant number of ions would enter the third region;

masking the first region;

doping the third region with a second dopant, the second dopant being an opposite dopant type as the monocrystalline silicon layer dopant; and doping the first region and the third region with a third dopant, the third dopant being the same dopant type as the second dopant, the third dopant dose being heavier than the first dopant dose, the second dopant diffusion coefficient being greater than the third dopant diffusion coefficient.

2. The method of claim 1, wherein the minimum tilt angle is equivalent to about an angle calculated as follows:

adding the thicknesses of the layers over the second region at the time of the first dopant doping step to form a height;

dividing the height by the third region width to form a quotient; and calculating the arc tangent of the quotient.

3. The method of claim 1, wherein the tilt angle is no more than an angle calculated as follows:

adding the thicknesses of the layers over the second region at the time of the first dopant doping step to form a height;

dividing the height by the first region width to form a quotient; and calculating the arc tangent of the quotient.

4. The method of claim 1, wherein the third dopant dose is greater than the second dopant dose, the third dopant is arsenic, the second dopant is phosphorus, and the monocrystalline silicon layer dopant and the first dopant are boron.

5. The method of claim 1, wherein the device is a flash EEPROM.

6. The method of forming an electrically erasable and electrically programmable memory device including a memory array having a plurality of field-effect memory cells on a semiconductor substrate comprising the steps of:

forming a tunnel dielectric layer over second regions within a doped monocrystalline silicon layer of the substrate, wherein the monocrystalline silicon layer includes first regions, the second regions, and third regions, the memory array being substantially rectangular, the memory array being configured such that every other region is a second region, each second region lying between and immediately adjacent to a first region and a third region;

depositing a floating gate layer over the tunnel dielectric layer;

forming a first patterned photoresist layer over the floating gate layer;

patterning the floating gate layer;

forming an intergate insulating layer over the floating gate layer;

forming a control gate layer over the intergate insulating layer;

forming a second patterned photoresist layer over the control gate layer;

patterning the control gate layer;

after forming the first patterned photoresist layer, doping the substrate with a first dopant, the first dopant being the same dopant type as the monocrystalline silicon layer dopant, the doping being done by ion implantation at a first tilt angle no less than a first minimum tilt angle and at about a first azimuthal angle such that a significant number of ions enter the first regions and the second regions near the first regions and substantially no ions enter the third regions, whereas if either the first tilt angle is less than the first minimum tilt angle or the azimuthal angle is not at about the first azimuthal angle, a significant number of ions would enter the third region;

after forming the first patterned photoresist layer, doping the substrate with a second dopant, the second dopant being the same dopant type as the first dopant, the doping being done by ion implantation at a second tilt angle no less than a second minimum tilt angle and at about a second azimuthal angle such that a significant number of ions enter the first regions and the second regions near the first regions and substantially no ions enter the third regions, whereas if either the second tilt angle is less than the second minimum tilt angle or the azimuthal angle is not at about the second azimuthal angle, a significant number of ions would enter the third region;

masking the first regions;

doping the third regions with a third dopant, the third dopant being an opposite dopant type as the monocrystalline silicon layer dopant; and doping the first regions and the third regions with a fourth dopant, the fourth dopant being the same dopant type as the third dopant, the fourth dopant dose within each first region being greater than the sum of the first dopant dose and second dopant dose within each first region, the third dopant diffusion coefficient being greater than the fourth dopant diffusion coefficient.

7. The method of claim 6, wherein the device is a flash EEPROM.

8. The method of claim 6, wherein each first region is wider than each third region.

9. The method of claim 8, wherein the first minimum tilt angle is about equivalent to an angle calculated as follows:

adding the thicknesses of the layers over a second region at the time of the first dopant doping step to form a height;

dividing the height by the widest third region width to form a quotient; and calculating the arc tangent of the quotient.

10. The method of claim 8, wherein the first tilt angle is no more than an angle calculated as follows:

adding the thicknesses of the layers over a second region at the time of the first dopant doping step to form a height;

dividing the height by the narrowest first region width to form a quotient; and calculating the arc tangent of the quotient.

11. The method of claim 8, wherein the second minimum tilt angle is about equivalent to an angle calculated as follows:

adding the thicknesses of the layers over a second region at the time of the second dopant doping step to form a height;

dividing the height by the widest third region width to form a quotient; and calculating the arc tangent of the quotient.

12. The method of claim 8, wherein the second tilt angle is no more than an angle calculated as follows:

adding the thicknesses of the layers over a second region at the time of the second dopant doping step to form a height;

dividing the height by the narrowest first region width to form a quotient; and calculating the arc tangent of the quotient.

13. The method of claim 8, wherein the fourth dopant dose is heavier than the third dopant dose, the fourth dopant is arsenic, the third dopant is phosphorus, and the monocrystalline silicon layer dopant, the first dopant, and the second dopant are boron.

14. The method of claim 8, wherein the first tilt angle is about the same as the second tilt angle.

15. The method of claim 14, wherein the first azimuthal angle is about 180° different relative to the second azimuthal angle.

* * * * *

UNITED STATES PATENT AND TRADEMARK OFFICE
CERTIFICATE OF CORRECTION

PATENT NO. : 5,190,887
DATED : March 2, 1993
INVENTOR(S) : Daniel N. Tang, et al It is certified that error appears in the above-indentified patent and that said Letters Patent is hereby corrected as shown below:

Col. 5, lines 65-66   Delete "and is substrate is rotated to an azimuthal angle of about 180°"

Signed and Sealed this

Twenty-ninth Day of November, 1994

Attest:

BRUCE LEHMAN

Attesting Officer

Commissioner of Patents and Trademarks